United States Patent
Tseng et al.

(10) Patent No.: US 11,042,202 B2
(45) Date of Patent: Jun. 22, 2021

(54) SERVER RACK WITH DYNAMIC POWER MANAGEMENT BY USING BASEBOARD MANAGEMENT CONTROLLERS

(71) Applicant: MITAC COMPUTING TECHNOLOGY CORPORATION, Hsinchu (TW)

(72) Inventors: Chia-Hung Tseng, Taoyuan (TW); Han-Ching Hsieh, Taoyuan (TW); Kuan-Ho Lin, Taoyuan (TW); Shun-Chi Lee, Taoyuan (TW)

(73) Assignee: Mitac Computing Technology Corporation

( * ) Notice: Subject to any disclaimer, the term of this patent is extended or adjusted under 35 U.S.C. 154(b) by 184 days.

(21) Appl. No.: 16/526,405

(22) Filed: Jul. 30, 2019

(65) Prior Publication Data
US 2020/0097057 A1    Mar. 26, 2020

(30) Foreign Application Priority Data
Sep. 21, 2018  (TW) .................................. 107133331

(51) Int. Cl.
*G06F 1/26*    (2006.01)
*H05K 7/14*    (2006.01)

(52) U.S. Cl.
CPC ............. *G06F 1/26* (2013.01); *H05K 7/1492* (2013.01)

(58) Field of Classification Search
CPC ................................ G06F 1/26; H05K 7/1492
See application file for complete search history.

(56) References Cited

U.S. PATENT DOCUMENTS

| | | | |
|---|---|---|---|
| 8,166,539 B2 | 4/2012 | Pan | |
| 8,250,382 B2 | 8/2012 | Maglione et al. | |
| 2014/0344389 A1* | 11/2014 | Hsieh | G06F 13/362 709/208 |
| 2016/0062936 A1* | 3/2016 | Brassac | G06F 13/4027 710/314 |
| 2018/0039552 A1* | 2/2018 | Moskowiz | G06F 11/0757 |
| 2020/0097057 A1* | 3/2020 | Tseng | G06F 1/26 |

FOREIGN PATENT DOCUMENTS

| | | |
|---|---|---|
| TW | 201502757 A | 1/2015 |
| TW | 201710895 A | 3/2017 |
| TW | 201719405 A | 6/2017 |

OTHER PUBLICATIONS

Search Report appended to an Office Action issued to Taiwanese counterpart application No. 107133331 by the TIPO dated May 30, 2019, with an English translation thereof.

* cited by examiner

*Primary Examiner* — Terrell S Johnson
(74) *Attorney, Agent, or Firm* — Lewis Roca Rothgerber Christie LLP

(57) ABSTRACT

A server rack includes a plurality of servers, each of which includes: a power management unit operable to convert a DC input voltage into at least one DC output voltage to output at least one type of DC output power; at least one application circuit for being respectively powered by the at least one type of DC output power; and a baseboard management controller cooperating with the power management unit to provide power management data. One of the baseboard management controllers of the servers is for receiving the power management data respectively from the other one(s) of the baseboard management controllers, and controls the power management units of the servers for power management of the servers based on the power management data.

18 Claims, 1 Drawing Sheet

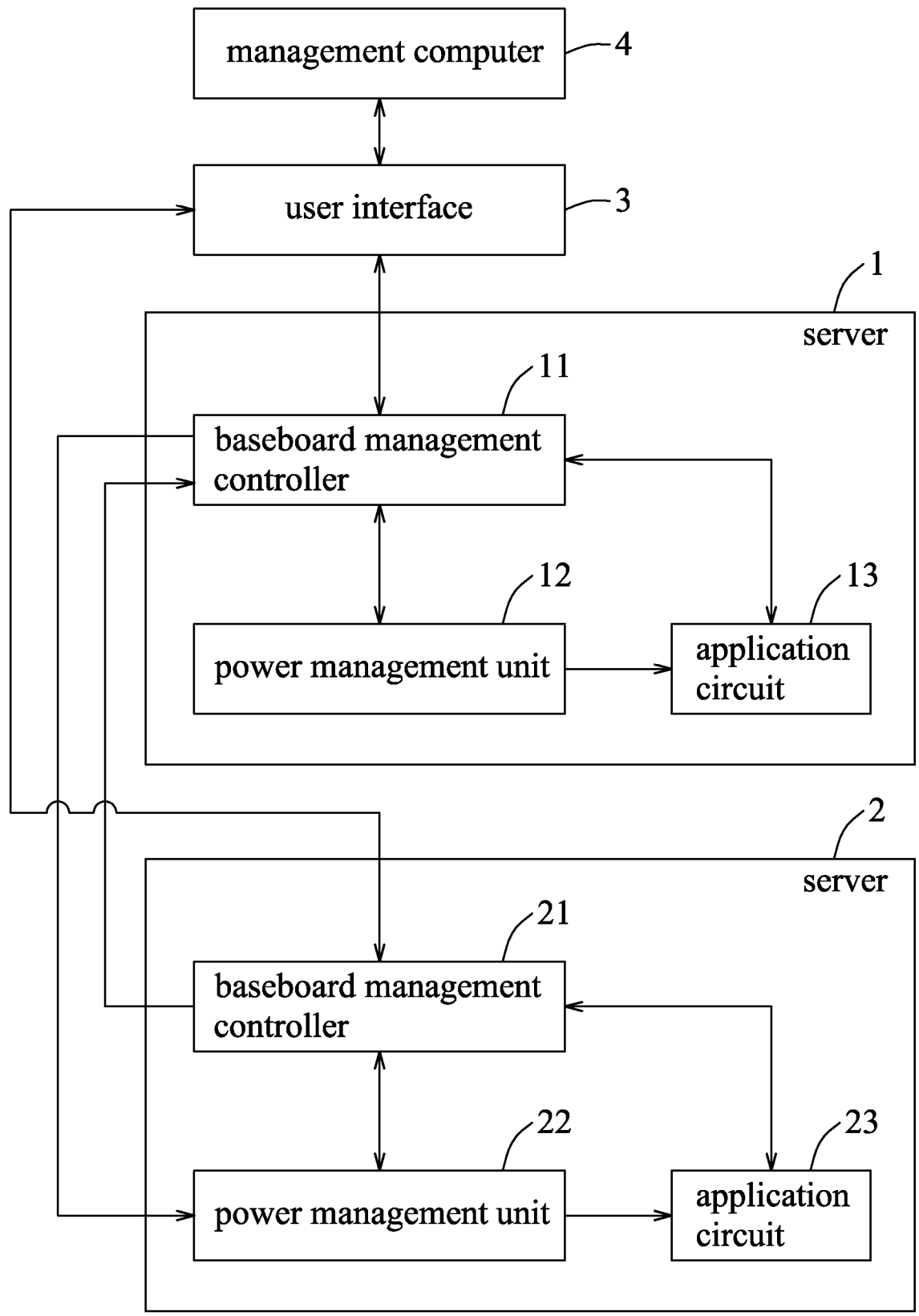

SERVER RACK WITH DYNAMIC POWER MANAGEMENT BY USING BASEBOARD MANAGEMENT CONTROLLERS

CROSS-REFERENCE TO RELATED APPLICATION

This application claims priority of Taiwanese Patent Application No. 107133331, filed on Sep. 21, 2018.

FIELD

The disclosure relates to a server rack, and more particularly to a server rack providing more power management functions.

BACKGROUND

A conventional server rack generally uses a single power supply to convert alternating current (AC) mains electricity into direct current (DC) supply power for powering multiple servers or nodes of the conventional server rack. For example, the power supply complies with the advanced technology extended (ATX) specification, and provides three supply voltages of 12V, 5V and 3.3V. Moreover, the power supply generally further monitors the supply voltages or their corresponding supply currents, and activates overvoltage or over-current protection mechanism when necessary. Although design of server racks has become increasingly complex, the conventional server rack only obtains limited power management data with the current power supply scheme, and therefore can only provide limited power management functions.

SUMMARY

Therefore, an object of the disclosure is to provide a server rack that can provide more power management functions.

According to the disclosure, the server rack includes a plurality of servers, each of which includes a power management unit, at least one application circuit and a baseboard management controller. For each of the servers, the power management unit is for receiving a type of direct current (DC) input power that is transmitted at a DC input voltage, and is operable to convert the DC input voltage into at least one DC output voltage to output at least one type of DC output power, each of which is transmitted at a respective one of the at least one DC output voltage, and each of which corresponds to a respective DC output current; each of the at least one application circuit is coupled to the power management unit for being powered by a respective one of the at least one type of DC output power therefrom; and the baseboard management controller is coupled to the power management unit, and cooperates with the power management unit to provide power management data corresponding to the server. One of the baseboard management controllers of the servers operates in a master mode and serves as a master baseboard management controller. Each of the rest of the baseboard management controllers operates in a slave mode and serves as a slave baseboard management controller. The master baseboard management controller is further coupled to the slave baseboard management controller(s), and to the power management unit(s) of one(s) of the servers that include(s) the slave baseboard management controller(s). Each of the slave baseboard management controller(s) transmits the power management data corresponding to the server that includes the slave baseboard management controller for receipt by the master baseboard management controller. The master baseboard management controller controls, for each of the servers, the power management unit of the server for power management of the server based on the power management data corresponding to the server.

BRIEF DESCRIPTION OF THE DRAWING

Other features and advantages of the disclosure will become apparent in the following detailed description of the embodiment with reference to the accompanying drawing, of which:

FIG. 1 is a block diagram illustrating an embodiment of a server rack according to the disclosure.

DETAILED DESCRIPTION

Referring to FIG. 1, an embodiment of a server rack according to the disclosure includes a number (M) of servers and other elements (e.g., at least one power supply, etc.) (not shown), where M≥2. Each of the servers includes a power management unit, an application circuit, a baseboard management controller and other elements (e.g., a network chip, etc.) (not shown). Any one of the servers may be a node of the server rack (i.e., a computer system that can operate independently in the server rack). It should be noted that, for each server, all of the elements thereof may be integrated on a single circuit board, or distributed among multiple circuit boards. In an example, for each server, all of the elements of the server are disposed on a respective mainboard. In another example, for each server, all of the elements, with the exception of the power management unit, are disposed on a respective mainboard, while the power management units of all the servers are disposed on a backplane shared by the servers.

In an example depicted in FIG. 1, M=2. As such, there are two servers 1, 2. The power management units of the servers 1, 2 are respectively labeled 12, 22. The application circuits of the servers 1, 2 are respectively labeled 13, 23. The baseboard management controllers of the servers 1, 2 are respectively labeled 11, 21.

For each of the servers, the power management unit is, for example, a voltage regulator (such as a linear regulator, a switching regulator or a silicon controlled rectifier (SCR) regulator), a microprocessor or a complex programmable logic device (CPLD), is for receiving a type of direct current (DC) input power transmitted at a DC input voltage, and is operable to convert the DC input voltage into a DC output voltage to output a type of DC output power transmitted at the DC output voltage. The type of DC output power corresponds not only to the DC output voltage, but also to a DC output current. The type of DC input power is provided by the at least one power supply (not shown) of the server rack. In an example, the at least one power supply complies with the advanced technology extended (ATX) specification, and converts alternating current (AC) mains electricity to provide at least one type of DC supply power each transmitted at a respective DC supply voltage (e.g., three types of DC supply power respectively transmitted at DC supply voltages of 12V, 5V and 3.3V); and one of the at least one type of DC supply power is received by the power management unit to serve as the type of DC input power. It should be noted that, the aforesaid description "the power management unit is for receiving a type of DC input power transmitted at a DC input voltage, and is operable to convert the DC input voltage into a DC output voltage to output a type of DC output power transmitted at the DC output voltage" does not mean that the power management unit receives only one type of DC input power and outputs only one type of DC output power. Instead, it means that the power management unit selectively outputs a number (L) of types of DC output power when receiving a number (N) of types of DC input power, where L≥1, N≥1 and L may be equal to or different from N.

For each of the servers, the application circuit is coupled to the power management unit for being powered by the DC output voltage and the DC output current therefrom (i.e., being power by the type of DC output power). The application circuit includes at least one electronic element (e.g., at least one of a central processing unit (CPU), a chipset or a graphics card along with its related circuits).

For each of the servers, the baseboard management controller is coupled to the power management unit and the application circuit, and cooperates with the power management unit to provide power management data corresponding to the server. In this embodiment, the power management data contains at least one of a magnitude of the DC output voltage, a magnitude of the DC output current, power consumption of the server (also referred to as the server power consumption) or operating information of the application circuit; and the operating information contains at least one of a magnitude of an operating voltage, a magnitude of an operating current, an operating power consumption, or an operating state of the application circuit. The magnitude of the DC output voltage and the magnitude of the DC output current are detected by the power management unit. The server power consumption is calculated by the baseboard management controller based on the magnitude of the DC output voltage and the magnitude of the DC output current. The magnitude of the operating voltage and the magnitude of the operating current are detected by one of the power management unit and the baseboard management controller. When the magnitude of the DC output voltage and the magnitude of the DC output current are detected by the power management unit to respectively serve as the magnitude of the operating voltage and the magnitude of the operating current, the magnitude of the type of DC output power is detected by the power management unit to serve as the operating power consumption. When the magnitude of the operating voltage and the magnitude of the operating current are detected by the baseboard management controller, the operating power consumption is calculated by the baseboard management controller based on the magnitude of the operating voltage and the magnitude of the operating current. The operating state is detected by the baseboard management controller.

One of the baseboard management controllers of the servers operates in a master mode and serves as a master baseboard management controller by executing respective firmware. Each of the rest of the baseboard management controllers operates in a slave mode and serves as a slave baseboard management controller by executing respective firmware. In an example, the baseboard management controllers communicate with one another to cooperatively determine which one of them serves as the master baseboard management controller. In another example, the baseboard management controllers communicate with a dedicated chip (not shown), and the dedicated chip determines which one of the baseboard management controllers serves as the master baseboard management controller. The master baseboard management controller is further coupled to the slave baseboard management controller(s), and to the power management unit(s) of one(s) of the servers that include(s) the slave baseboard management controller(s). For example, in the example depicted in FIG. 1, the baseboard management controller 11 is the master baseboard management controller, the baseboard management controller 21 is the slave baseboard management controller, and the master baseboard management controller 11 is further coupled to the slave baseboard management controller 21 and the power management unit 22.

Each slave baseboard management controller transmits the power management data corresponding to the server that includes the slave baseboard management controller for receipt by the master baseboard management controller. In the example depicted in FIG. 1, the slave baseboard management controller 21 transmits the corresponding power management data for receipt by the master baseboard management controller 11.

The master baseboard management controller controls, for each of the servers, operation of the power management unit for power management of the server based on the power management data corresponding to the server. In the example depicted in FIG. 1, the master baseboard management controller 11 controls operation of the power management unit 12 for power management of the server 1 based on the power management data corresponding to the server 1, and controls operation of the power management unit 22 for power management of the server 2 based on the power management data corresponding to the server 2. In detail, the master baseboard management controller controls the power management unit of each of the servers based on the power management data corresponding to the server and a respective and predetermined first overload threshold, such that the power management unit does not output the type of DC output power (e.g., by ceasing to convert the DC input voltage into the DC output voltage) when the power management unit is determined by the master baseboard management controller to be overloaded. In an example, for each of the servers, the power management data at least contains the magnitude of the DC output current; the first overload threshold is a current value; and when the magnitude of the DC output current contained in the power management data is determined to be greater than the first overload threshold, the power management unit is controlled by the master baseboard management controller not to output the type of DC output power to avoid overload.

In an example where, for each of the servers, the power management data at least contains the operating information, the baseboard management controller further controls operation of the application circuit for power management of the server based on the operating information contained in the corresponding power management data. In detail, the baseboard management controller controls the application circuit based on the operating information and a respective and predetermined second overload threshold, such that an operating mode of the application circuit is changed when the application circuit is determined by the baseboard management controller to be overloaded. In an example, the application circuit includes a graphics card; the operating information at least contains the magnitude of the operating current; the second overload threshold is a current value; and when the magnitude of the operating current contained in the operating information is determined to be greater than the second overload threshold, the application circuit 13 is controlled by the baseboard management controller to enter a power saving mode. In another example, the application circuit includes a CPU; the operating information at least contains the operating power consumption; the second overload threshold is a power consumption value; and when the operating power consumption contained in the operating information is determined to be greater than the second overload threshold, the application circuit is controlled by the baseboard management controller to enter a frequency reduction mode.

It should be noted that the second overload thresholds respectively used by the baseboard management controllers of the servers may be different from one another, depending on the configuration differences among the application circuits of the servers. In addition, for each of the servers, when the application circuit receives the type of DC output power from the power management unit via a plurality of power transmission pathways, a plurality of second overload thresholds respectively corresponding to the power transmission pathways may be used by the baseboard management controller, and may be the same or different from one another. In an example where the operating information at least contains the operating power consumption and where each second overload threshold is a power consumption value, for each of the power transmission pathways, the baseboard management controller detects magnitudes of an operating voltage and an operating current that are related to the power transmission pathway, calculates, based on the magnitudes of the operating voltage and the operating current, an operating power consumption related to the power transmission pathway, and compares the operating power consumption with the second overload threshold corresponding to the power transmission pathway. Moreover, in another embodiment, for each of the servers, when the application circuit is determined to be overloaded, the baseboard management controller may control the power management unit to stop outputting the type of DC output power, instead of controlling the application circuit to change its operating mode.

It should also be noted that, in yet another embodiment, each of at least one of the servers may include more than one application circuit. For each of the server(s) that include(s) multiple application circuits, a plurality of second overload thresholds respectively corresponding to the application circuits maybe used by the baseboard management controller, and maybe the same or different from one another. In addition, the power management unit may be operable to convert the DC input voltage into a plurality of DC output voltages to output a plurality of types of DC output power respectively transmitted at the DC output voltages to respectively power the application circuits; and for each of the application circuits, when the application circuit is determined to be overloaded, the output of the types of the DC output power may be stopped, or the output of one of the types of DC output power that is for powering the application circuit may be stopped.

It should also be noted that each of the power management units of the servers and the at least one power supply (not shown) of the server rack may include an overload protection circuit (not shown) that monitors the voltage or current outputted by the power management unit or power supply, and that activates its protection mechanism when necessary. The overload protection circuits of the power management units and the at least one power supply are used to prevent hardware damages due to overloads of the application circuits of the servers. On the other hand, for each of the servers, an overload related to the first overload threshold means that a parameter related to the power management unit (e.g., the magnitude of the DC output voltage, the magnitude of the DC output current, or the server power consumption) is outside of its predetermined range; and an overload related to the second overload threshold means that a parameter related to the application circuit (e.g., the magnitude of the operating voltage, the magnitude of the operating current, or the operating power consumption) is outside of its predetermined range. The baseboard management controllers perform power management to return the parameters to their predetermined ranges.

Moreover, one can operate a user interface 3 by using a management computer 4 to:

(a) control the master baseboard management controller to monitor the operations of the application circuits of all servers via the slave baseboard management controller(s) and the power management units, so that the master baseboard management controller collects the operating information of the application circuits, and transmits the collected operating information to the management computer 4 via the user interface 3;

(b) receive and monitor the power management data collected by the master baseboard management controller (The master baseboard management controller transmits the power management data collected thereby to the management computer 4 via the user interface 3.);

(c) control, via the master baseboard management controller, the supply of power to each server and/or each application circuit; or (d) control the operations of the application circuits of all servers via the master baseboard management controller and based on the operating information of the application circuits (The master baseboard management controller collects the operating information of each application circuit, transmits the collected operating information to the management computer 4 via the user interface 3, and receives, via the user interface 3, control commands that are generated by the management computer 4 respectively based on the operating information of the application circuits. The master baseboard management controller controls the operation of the application circuit of the server that includes the master baseboard management controller based on one of the control commands that is related to the operating information of the application circuit. The master baseboard management controller transmits the rest of the control commands respectively to the slave baseboard management controller(s), and each slave baseboard management controller controls, based on the control command received thereby, the operation of the application circuit of the server that includes the slave baseboard management controller.).

The user interface 3 may be local to the server rack of this embodiment and directly coupled to the baseboard management controllers as shown in FIG. 1, or may be remote from the server rack of this embodiment and linked to the baseboard management controllers via a network dedicated to the baseboard management controllers.

Furthermore, one can operate the user interface 3 to: (a) control the master baseboard management controller to update the first overload thresholds; and (b) control each baseboard management controller to update the second overload threshold. Alternatively, the master baseboard management controller may automatically update the first overload thresholds when necessary, and each baseboard management controller may automatically update the second overload threshold when necessary.

In a modification of this embodiment, the at least one power supply (not shown) of the server rack may be omitted, and each of the servers may further include a power supply unit for providing the type of DC input power required by the power management unit of the server.

In view of the above, the server rack of this embodiment can provide more power management functions as compared to the conventional server rack since: (a) the master baseboard management controller obtains the power management data corresponding to each of the servers directly by itself or indirectly from the slave baseboard management controller, and controls operation of the power management unit of each of the servers based on the corresponding power management data; and, optionally, (b) for each of the servers, the baseboard management controller obtains the operating information of the application circuit, and controls operation of the application circuit based on the operating information. In addition, the server rack of this embodiment can be remotely monitored and controlled.

In the description above, for the purposes of explanation, numerous specific details have been set forth in order to provide a thorough understanding of the embodiment. It will be apparent, however, to one skilled in the art, that one or more other embodiments maybe practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A server rack comprising a plurality of servers, each of which includes:
   a power management unit for receiving a type of direct current (DC) input power that is transmitted at a DC input voltage, and operable to convert the DC input voltage into at least one DC output voltage to output at least one type of DC output power, each of which is transmitted at a respective one of the at least one DC output voltage, and each of which corresponds to a respective DC output current;
   at least one application circuit each coupled to said power management unit for being powered by a respective one of the at least one type of DC output power therefrom; and
   a baseboard management controller coupled to said power management unit, and cooperating with said power management unit to provide power management data corresponding to said server;
   wherein one of said baseboard management controllers of said servers operates in a master mode and serves as a master baseboard management controller, each of the rest of said baseboard management controllers operates in a slave mode and serves as a slave baseboard management controller, and said master baseboard management controller is further coupled to said slave baseboard management controller(s), and to said power management unit(s) of one(s) of said servers that include(s) said slave baseboard management controller(s);
   wherein each of said slave baseboard management controller(s) transmits the power management data corresponding to said server that includes said slave baseboard management controller for receipt by said master baseboard management controller;
   wherein said master baseboard management controller controls, for each of said servers, said power management unit of said server for power management of said server based on the power management data corresponding to said server.

2. The server rack of claim 1, wherein:
   for each of said servers, the corresponding power management data contains at least one of a magnitude of each of the at least one DC output voltage, a magnitude of the DC output current that corresponds to each of the at least one DC output voltage, power consumption of said server or operating information of each of said at least one application circuit; and
   said master baseboard management controller controls, for each of said servers, said power management unit based on the power management data corresponding to said server and a respective and predetermined first overload threshold, such that said power management unit does not output the at least one type of DC output power when said power management unit is determined to be overloaded.

3. The server rack of claim 2, wherein for each of said servers, said power management unit ceases to convert the DC input voltage into the at least one DC output voltage, so as not to output the at least one type of DC output power.

4. The server rack of claim 1, wherein for each of said servers, the corresponding power management data at least contains operating information of each of said at least one application circuit.

5. The server rack of claim 4, wherein the operating information of each of said application circuits of said servers contains at least one of a magnitude of an operating voltage, a magnitude of an operating current, an operating power consumption, or an operating state of said application circuit.

6. The server rack of claim 4, wherein for each of said servers, the operating information of each of said at least one application circuit is detected by said baseboard management controller.

7. The server rack of claim 4, wherein for each of said servers, the operating information of each of said at least one application circuit is detected by said power management unit.

8. The server rack of claim 4, wherein for each of said servers, said baseboard management controller is further coupled to said at least one application circuit, and further controls each of said at least one application circuit for power management of said server based on the operating information of said application circuit.

9. The server rack of claim 8, wherein for each of said servers, said baseboard management controller determines whether each of said at least one application circuit is overloaded based on the operating information of said application circuit and a respective and predetermined second overload threshold.

10. The server rack of claim 9, wherein in each of said servers, for each of said at least one application circuit, said baseboard management controller controls said application circuit to change an operating mode thereof when said application circuit is determined to be overloaded.

11. The server rack of claim 9, wherein in each of said servers, for each of said at least one application circuit, said baseboard management controller controls said application circuit to enter a power saving mode when said application circuit is determined to be overloaded.

12. The server rack of claim 9, wherein in each of said servers, for each of said at least one application circuit, said baseboard management controller controls said application circuit to enter a frequency reduction mode when said application circuit is determined to be overloaded.

13. The server rack of claim 4, wherein for each of said servers, said baseboard management controller controls said power management unit for power management of said server based on the operating information of each of said at least one application circuit, such that said power management unit does not output the at least one type of DC output power when said application circuit is determined to be overloaded.

14. The server rack of claim 4, wherein for each of said servers, said baseboard management controller controls said power management unit for power management of said server based on the operating information of each of said at least one application circuit, such that said power management unit does not output one of the at least one type of DC output power that is for powering said application circuit when said application circuit is determined to be overloaded.

15. The server rack of claim 1, wherein said master baseboard management controller collects the operating information of said at least one application circuit of one of said servers, and transmits the operating information to a management computer via a user interface.

16. The server rack of claim 1, wherein said master baseboard management controller transmits the power management data corresponding to one of said servers to a management computer via a user interface.

17. The server rack of claim 1, wherein:
said master baseboard management controller collects the operating information of said at least one application circuit of said server that includes said master baseboard management controller, and transmits the operating information to a management computer via a user interface; and
said master baseboard management controller receives, via the user interface, a control command that is generated by the management computer based on the operating information, and controls, based on the control command, operation of said at least one application circuit of said server that includes said master baseboard management controller.

18. The server rack of claim 1, wherein:
said master baseboard management controller collects the operating information of said at least one application circuit of said server that includes one of said slave baseboard management controller(s), and transmits the operating information to a management computer via a user interface;
said master baseboard management controller receives, via the user interface, a control command that is generated by the management computer based on the operating information, and transmits the control command to said one of said slave baseboard management controller(s); and
said one of said slave baseboard management controller(s) controls, based on the control command, operation of said at least one application circuit of said server that includes said one of said slave baseboard management controller(s).

* * * * *